March 30, 1965 W. E. ROWE 3,176,191
COMBINED CIRCUIT AND MOUNT AND METHOD OF MANUFACTURE
Filed May 10, 1960 2 Sheets-Sheet 1
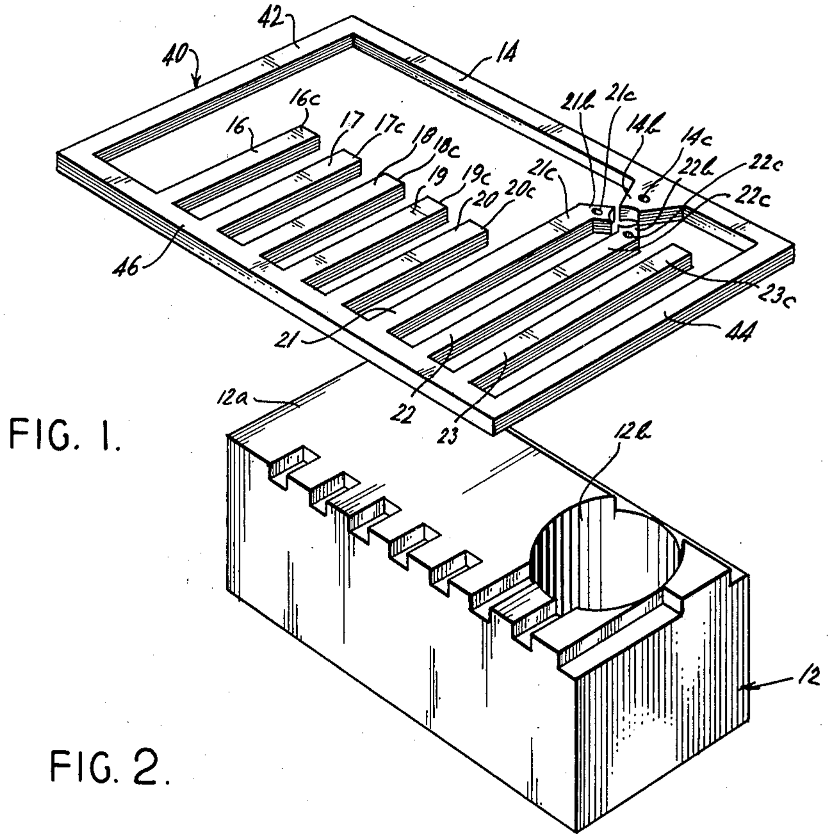
FIG. 1. FIG. 2.
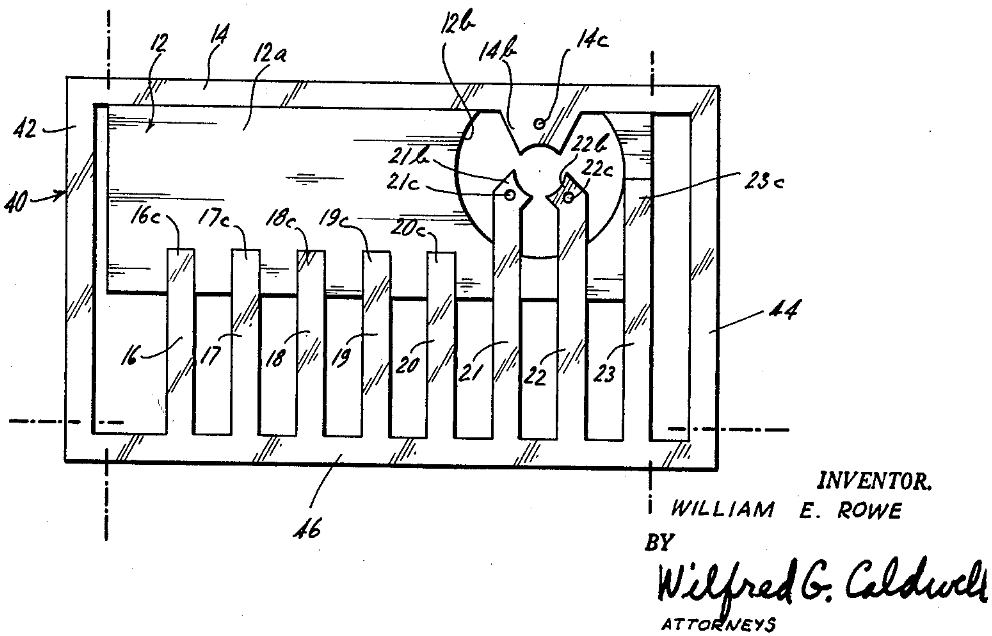
INVENTOR.
WILLIAM E. ROWE
BY
Wilfred G. Caldwell
ATTORNEYS March 30, 1965 W. E. ROWE 3,176,191

COMBINED CIRCUIT AND MOUNT AND METHOD OF MANUFACTURE

Filed May 10, 1960 2 Sheets-Sheet 2

United States Patent Office 3,176,191
Patented Mar. 30, 1965

3,176,191

COMBINED CIRCUIT AND MOUNT AND METHOD OF MANUFACTURE

William E. Rowe, Newburyport, Mass., assignor to Columbia Broadcasting System, Inc., Danvers, Mass., a corporation of New York Filed May 10, 1960, Ser. No. 28,132
6 Claims. (Cl. 317—101)

The present invention relates generally to a unitary electronic circuit package, and in particular to a prefabricated mount and housing for a transistor combining therein associated circuitry as a unitary package, and to a method for mass production of miniaturized assemblies of this type.

In recent times there has been an increasing need for miniaturized electrical and electronic circuits and components. The transistor because it can be made quite small without encountering such serious problems as are presented by the miniaturization of vacuum tubes, has been in the forefront of the advances toward miniaturization. Printed circuitry is another development which has made it possible to condense electronic devices to a point previously unattained. In addition, advances have been made in the miniaturization of conventional circuit components such as capacitors, inductors, and resistors.

It is broadly an object of this invention to further advance the miniaturization of electronic equipment by providing a prefabricated, miniaturized circuit unit and a method of manufacturing the same. More specifically, it is an object of this invention to provide a circuit unit having terminals adapted for connection to a larger circuit, which is entirely contained within a single miniaturized package, and which has a built-in internal circuitry predetermined and selected in relation to a specific circuit application. Then it is only necessary to connect the terminals of the circuit unit in the appropriate manner to the terminals of another device in which it is to be assembled, and the necessary circuitry and electronic components will be automatically connected in the proper manner.

Further objects of this invention are to provide mounts for circuit elements, such as small transistors, which serve to provide physical support for transporting the transistor and for assembling it into an electronic circuit or device. In addition, it is an object of the invention to provide an enclosure or housing for the small transistor employed. This is useful even in the case of the type of transistor which is already encapsulated in its own shell and has three terminal prongs protruding from the shell. But it is especially important in the case of a tiny unencapsulated transistor consisting simply of a base wafer with emitter and collector electrodes on either side thereof, where some means must be provided for enclosing this fragile structure. By providing such an enclosure, this invention achieves the additional object of permitting the direct use of unencapsulated transistors without any necessity for providing a separate shell therefor.

An additional object of the invention is to provide a convenient and foolproof means for establishing electrical contact to the terminals of the circuit element or transistor. A further object is to provide associated circuitry and circuit components built in to the mount to provide a prefabricated unitary circuit package ready for working connection to another circuit, and terminals for establishing such connection.

A still further object is to provide an effective method for rapid, inexpensive production of such assemblies on a mass basis, and for achieving small enough dimensions to satisfy the requirements of miniaturization.

In accordance with an illustrative embodiment of this invention, there is provided a prefabricated mount and circuit unit for use with a circuit element such as transistor having terminals for the connection thereto of sources of potential and/or circuit components. The prefabricated mount and circuit comprises a unitary package including mounting panel which is formed of a non-conductive material and plurality of spaced conductors embedded in one surface thereof. The mounting panel is formed with a through bore which intersects the aforesaid surface and is sized to receive the circuit element. Some of the conductors are formed with contact tabs positioned in relation to the bore to contact the terminals in order to establish connections to the circuit element when the latter is inserted in the bore. In some instances, the package is constructed to provide a predetermined internal circuitry appropriate for a selected application, which circuitry includes various circuit components interconnected between the embedded conductors.

In accordance with an illustrative method for prefabricating a mount and circuit package, a mounting panel is formed of a non-conductive material with a through bore which intersects one surface thereof and is sized to receive a circuit element having terminals. A plurality of spaced conductors, some of which are formed with contact tabs, are in part embedded in the aforesaid surface of the mounting panel in such manner that the contact tabs traverse the bore in position to contact the terminal means of the circuit element when the latter is mounted in the panel opening.

The foregoing brief summary, as well as additional features and advantages of the invention, may best be appreciated by reference to the following detailed description and the accompanying drawings, wherein:

FIG. 1 is an exploded perspective view of a combined mount and circuit unit in an incomplete stage of manufacture, including molded mounting panel body and a circuit stencil for use with an encapsulated transistor, the stencil having been removed for clarity of illustration from its normal position embedded in the top surface of the mounting panel body;

FIG. 2 is a top plan view of the aforesaid mounting panel with the said stencil embedded therein with broken lines to indicate the planes along which the circuit stencil is cut in accordance with method aspects of this invention;

Figure 3:
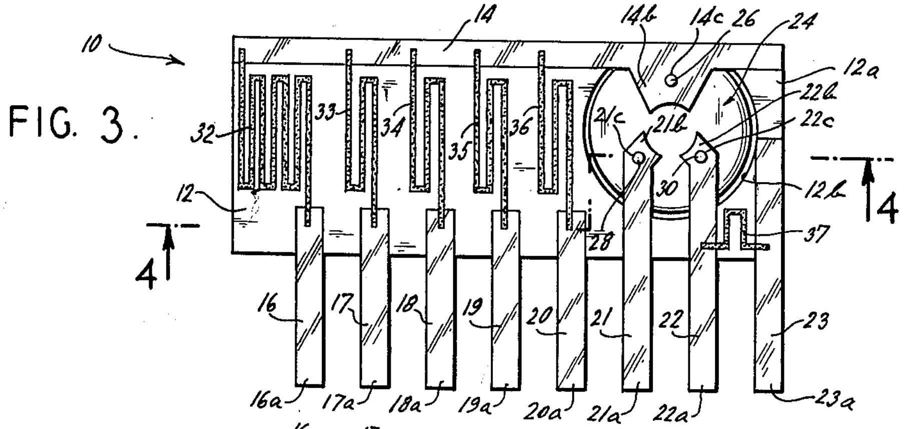
Figure 4:
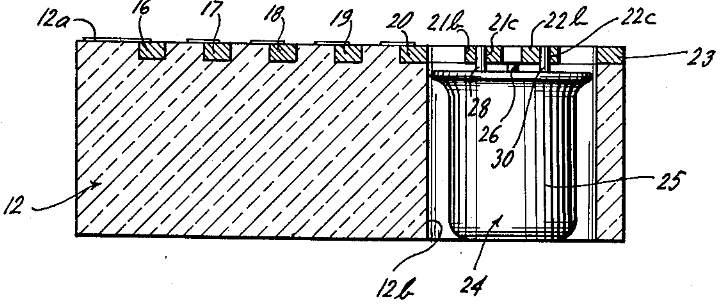
Figures 5, 6, 7, 8:
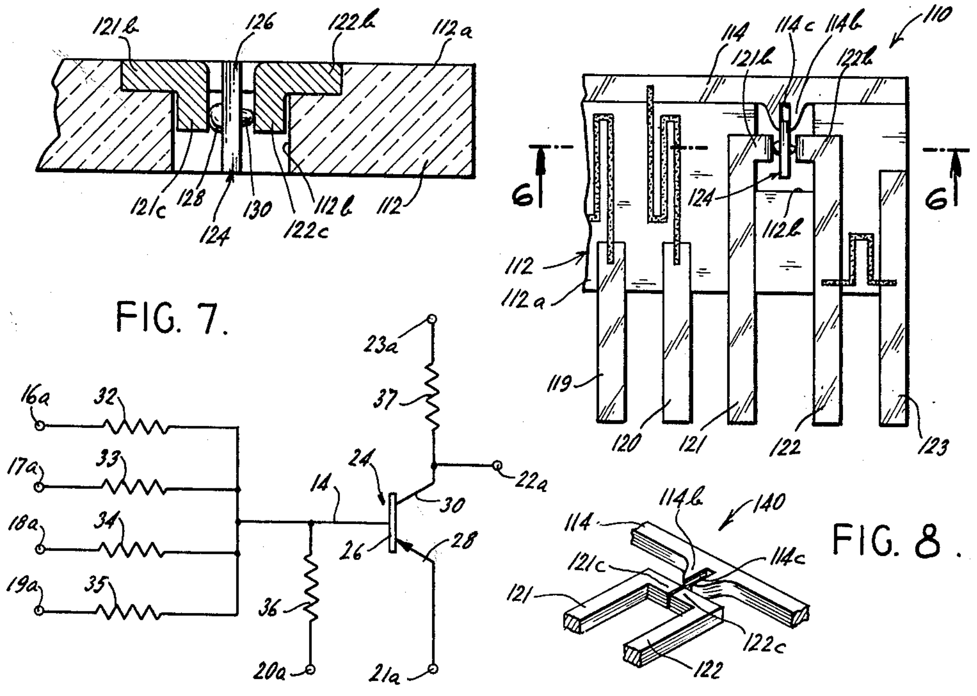

FIG. 3 is a similar top plan view of a completed mount and circuit unit including the mounting panel and circuit stencil of the previous figures with portions of the circuit stencil removed as indicated by the cutting lines of FIG. 2, with resistor stripes imprinted over the mounting panel surface between the circuit stencil strips embedded therein and an encapsulated transistor mounted in a bore formed in the mounting panel and connected to contact tabs formed on the stencil strips;

FIG. 4 is a sectional view of the mount and circuit unit of FIG. 3 taken along the lines 4—4 thereof;

FIG. 5 is a top plan view similar to that of FIG. 3 of a portion of a completed mount and circuit unit including an unencapsulated transistor;

FIG. 6 is a sectional view of the mount and circuit unit of FIG. 5 taken along the lines 6—6 thereof;

FIG. 7 is a schematic diagram of the internal circuit of units of FIGS. 3 and 4 and of FIGS. 5 and 6; and, FIG. 8 is a perspective view similar to that of FIG. 1 of a portion of a circuit stencil designed for use with an unencapsulated transistor.

Referring specifically to the drawings, and especially to FIGS. 3 and 4, there is seen a combined mount and circuit unit, designated generally by the numeral 10, which includes a mounting panel 12 of rectangular parallelepiped shape. Embedded in the surface 12*a* of the mounting panel 12 are a number of metallic conductor strips. These include an internal circuit connector strip 14 and 16 through 23 electrically insulated from each other. Each of the circuit terminal strips 16 through 23 includes a terminal tab portion 16*a* through 23*a* respectively which protrudes beyond the mounting panel 12 to provide a row of convenient terminals for connection to the circuit unit 10.

The mounting panel 12 is formed with a bore 12*b* which extends entirely through the mounting panel 12 perpendicularly to the surface 12*a* thereof and which intersects or opens upon the surface 12*a*. The bore 12*b* has a diameter selected in relation to a small encapsulated transistor 24 having a shell 25 for the shell 25 to be received snugly within the panel opening for mounting therein so that the mounting panel forms a physical mounting and a protective enclosure for the transistor 24. As seen in FIG. 4, the thickness of the mounting panel 12 in a direction perpendicular to the surface 12*a* thereof is large enough so that the transistor 24 and its base, emitter, and collector prongs 26, 28, and 30 respectively may be accommodated entirely within the axial extent of the panel opening 12*b*. This avoids protrusion of the transistor 24 from the top and bottom surfaces of the mounting panel 12 when mounted in the bore 12*b*. In order to provide electrical connections to the transistor 24, the internal circuit connector strip 12 is formed with a base contact tab 14*b*, while two of the circuit terminal strips 21 and 22 are formed with emitter and collector contact tabs 21*b* and 22*b* respectively. All three transistor terminal contact tabs extend across the end of the bore 12*b* adjacent the surface 12*a* and have respective holes 14*c*, 21*c*, and 22*c* sized to receive the base, emitter, and collector terminal prongs 26, 28, and 30 respectively.

The prong-receiving holes 14*c*, 21*c* and 22*c* may be sized for a tight friction fit with the respective transistor terminal prongs 26, 28, and 30. This not only provides a superior electrical contact, but affords a means of physically retaining the transistor 24 in the assembly of the unit 10. At the same time, a transistor 24 so mounted in the circuit unit 10 is readily removable, by the application of deliberate extraction pressure, in case replacement is desired. In the event that it is not important to provide for replacement of the transistor 24, electrical contact and physical mounting may be further enhanced by alloying the terminal prongs 26, 28, and 30 to the contact tabs 14*b*, 21*b*, and 22*b* in accordance with methods which will presently be described.

In accordance with the requirements for components and internal circuitry of the particular application contemplated, a plurality of resistor stripes 32 through 37 of a conductive material of relatively high resistivity may be imprinted over the panel surface 12*a*. Each of the resistor stripes 32 through 37 has opposite ends which terminate in contact with two of the conductor strips 14 and 16 through 23 so as to establish a resistor connected therebetween. The resistor stripes 32 through 37 are imprinted in a convoluted configuration so as to achieve a greater length and thereby attain a desired resistance.

FIGS. 5 and 6 employ reference characters in the hundreds series which match those in the tens series of FIGS. 3 and 4 to illustrate the corresponding parts of a similar unit 110 designed for use with an unencapsulated transistor 124. The unit 110 is exactly the same as the circuit unit 10 in all respects excepts those which will now be mentioned. The transistor 124 includes simply a base wafer 126, and an emitter electrode 128 and collector electrode 130 alloyed to opposite sides of the base wafer 126. There is no separate protective shell such as the shell 25. The mounting panel 112 of this embodiment is formed with a rectangular bore 112*b* in which the transistor 124 is mounted to provide the necessary enclosure to protect the fragile structure thereof. As seen in FIG. 6, the thickness of the mounting panel 112 perpendicular to the surface 112*a* thereof is less than the corresponding dimension of mounting panel 12 but is still adequate for the unencapsulated transistor 124 to be accommodated entirely within the length of the bore 112*b*. The internal circuit connector strip 114 of this embodiment is formed with a base contact tab 114*b* which has a notch 114*c* sized for a tight friction fit with the base wafer 126. The circuit terminal strips 121 and 122 of this embodiment are formed with emitter and collector contact tabs 121*b* and 122*b* respectively which terminate in resilient clips 121*c* and 122*c* respectively curving downwardly into the bore 112*b* and contacting the emitter and collector electrodes 128 and 130 respectively. The spring clips 121*c* and 122*c* are spaced for a force fit with transistor 124 so as to provide a firm grip thereon when the transistor is inserted therebetween. In this manner, not only is a firm electrical contact made with the base wafer 126 and emitter and collector electrodes 128 and 130, but the friction grip of the notch 114*c* on the base wafer 126 on the spring clip action of the clips 121*c* and 122*c* serve to physically retain the transistor 124 within the bore 112*b*.

FIG. 7 shows the internal circuitry provided by either of the illustrative mount and circuit units 10 or 110, using the former as an example. Electrically, the circuit comprises a series of terminals 16*a* through 23*a* by means of which the unit can be connected to any desired circuit or device. The terminals are interconnected internally of the unit by the network of resistors 32 through 37 and a transistor 24 to form an internal circuit designed in accordance with the operating requirements of the circuit or device to which the circuit unit is to be connected. Clearly, a great variety of internal circuits is possible by varying the arrangement of the conductor strips 14 and 16 through 23, as well as the placement and connection of the resistor stripes 32 through 37 and the transistor 24. In addition, it is within the contemplation of this invention to employ other well known circuit elements such as capacitors, inductors, vacuum tubes and the like in addition to or instead of the resistor stripes and transistors of the illustrative units shown.

It will now be appreciated that the combined mount and circuit units 10 and 110 provide convenient prefabricated or ready-made self-contained or unitary packages having terminals for ready connection to a large electronic circuit or device and which can be provided with almost any required built-in internal circuitry to supply the necessary arrangement of resistors, transistors, and other circuit components for cooperation therewith, and which inherently provides a support and housing for such circuit components. In addition, it will be seen that the use of imprinted resistors and small transistors allows the assembly to be easily made on a miniature scale.

One of the greatest advantages of the above described circuit unit is the ease and rapidity with which this unit can be manufactured. In particular, this invention contemplates a novel method of manufacturing combined mount and circuit units in which the necessary internal circuitry is easily built in, and the circuit unit is made very small in accordance with the requirements of miniaturization. Referring particularly to FIGS. 1 and 2, in order to manufacture the unit 10, a metal stencil 40 is first formed. This stencil may be stamped in the necessary shape or, if required by the thickness of metal and fineness of line pattern, the stencil may be made by well known photo-engraving methods. For example, a resist pattern may be applied on both sides of a metal plate, and the plate can then be etched to the desired configuration. The illustrative circuit stencil 40 is seen to include a closed rectangle including the internal circuit connector strip 14 and a frame member composed of a pair of side rails 42 and 44 and a front rail 46. The circuit terminal strips 16 through 23 are formed as integral extensions of the back-rail 46 protruding into the interior of the rectangle. The base contact tab 14*b* is formed as an integral extension of the internal circuit connector 14 and likewise projects into interior of the rectangle. The emitter and collector contact tabs 21*b* and 22*b* are formed at the tips of the circuit terminal strips 21 and 22 respectively. All of the transistor terminal contact tabs 14*b*, 21*b* and 22*b* are formed with the necessary prong-receiving holes, 14*c*, 21*c* and 22*c* respectively.

A circuit stencil 140 designed for the unit 110 would be formed somewhat differently, as seen in FIG. 8. The base contact tab 114*b* formed on the internal circuit connector strip 114 would have the notch 114*c* for receiving the base wafer of an unencapsulated transistor. The emitter and collector contact tabs would be formed with end portions 121*c* and 122*c* extending colinearly toward each other. The latter can subsequently be turned downwardly out of the plane of the stencil 140 to form the electrode-gripping resilient clips of the unit 110.

It will be readily appreciated that the particular configurations of the illustrative circuit stencils 40 and 140, which determine in part the internal circuitry of units 10 and 110, may be altered at will to produce an endless variety of configurations adapted for almost any internal circuit which various applications may require. Indeed it is one of the principal advantages of the invention herein that a great variety of internal circuits may be manufactured on a mass-production basis by the simple expedient of changing the circuit stencil.

The next step in the process of fabrication of either unit, as, for example the unit 10, is to mount the stencil 40 in a suitable die or mold adapted for molding the parallelepiped shape of the mounting panel 12. A suitable core is inserted to form the required bore 12*b* therein. The circuit stencil 40 is held in the mold in position for the portions thereof which are inside the mold cavity to become embedded in the surface 12*a* of the mounting panel, with the transistor terminal contact tabs 14*b*, 21*b*, and 22*b* extending across the end of the bore 12*b* adjacent the surface 12*a*. The circuit stencil 40 is so positioned within the mold that certain portions thereof are disposed within the mold cavity so as to become embedded in the mounting panel, while other portions are outside. Specifically, the internal circuit connector strip 14 is largely inside the mold cavity, but the opposed ends thereof protrude outside. The frame member, including the side rails 42 and 44 which adjoin the opposed ends of the external circuit connector strip 14 and the front rail 46, is outside the mold cavity. The circuit terminal strips 16 through 23 are partly within and partly outside the mold cavity. The terminal tab portions thereof 16*a* through 23*a* protrude outside the mold cavity and adjoin the front rail 46. However, connecting portions 16*c* through 23*c* of the circuit terminal strips 16 through 23 extend into the interior of the mold cavity.

A suitable non-conductive material of which to mold the mounting panel 12 is then injected into the mold cavity. Glass-bonded mica is preferred, since it is readily moldable and may be conveniently injected in paste form into the mold cavity. This material, which is manufactured and sold by the Mycalex Corporation of America under the trade name "Mycalex," is also suitable for the present application in that it has a high dielectric constant, as well as good high-frequency characteristics and resistance to high temperatures.

When the blass-bonded mica material has hardened with the metallic circuit stencil 40 embedded in the surface 12*a* thereof, the assembly is removed from the die. The frame member 42, 44, 46 is then cut from the internal circuit strip 14 and from the terminal tabs 16*a* through 23*a*, along the broken lines of FIG. 2. The protruding ends of internal circuit connector strip 14 are severed, leaving behind only so much of the strip 14 as is embedded in the mounting panel 12. In addition, the circuit terminal strips 16 through 23 are severed close to the front rail 46 in order to leave long terminal tabs 16*a* through 23*a* protruding from the mounting panel for easier connection to the circuit unit 10. The connecting portions 16*c* through 23*c* of the circuit terminal strips are embedded in the mounting panel surface 12*a*, while the transistor terminal contact tabs 14*b*, 21*b* and 22*b* are so located as to extend across the end of the bore 12*b*.

The resistors 32 to 37 are printed over the mounting panel surface 12*a* by standard printed circuit techniques. For example, evaporated Nichrome may be plated over the mounting panel surface 12*a* through a suitable stencil mask under vacuum conditions. Nichrome is a preferred material for the resistors 32 through 37 because of its relatively high resistivity and its adaptability for deposit by evaporation in this manner. It will be appreciated that a suitable stencil mask can be developed for any of the endless variety of internal circuits which can be developed, thus permitting the manufacture of different circuits by simply changing the stencil mask.

The encapsulated transistor 24 of unit 10 is then inserted into the bore 12*b* and the base, emitter, and collector terminal prongs 26, 28 and 30 respectively are inserted into the prong-receiving holes 14*c*, 21*c* and 22*c*. In the case of the unit 110, the unencapsulated transistor 124 is inserted into bore 112*b*, the base wafer 126 is inserted into the notch 114*c* and the emitter and collector electrode 128 and 130 respectively are brought into contact with the spring clips 121*c* and 122*c* so that the transistor 124 is gripped therebetween. As previously noted, the prong-receiving holes 14*c*, 21*c* and 22*c* and the wafer-receiving notch 114*c* and spring clips 121*c* and 122*c* may be so dimensioned as to form friction fits with the transistors 24 and 124 respectively sufficiently tight to form a physical mounting for these transistors which permits replacement thereof.

However( if it is desired to make a permanent assembly of the collector circuit units 10 and 110, it is preferable to connect arc welding electrodes across the transistor terminals and to pass a sufficiently high current arc between the transistor terminals and the contact tabs contiguous thereto to cause a certain degree of alloying herebetween. The resuling product is a permanent assembly comprising a complete circuit unit ready to function upon connection to any desired electronic circuit or device.

It will now be seen that this invention provides a convenient prefabricated, self-contained unit comprising a circuit which includes various components and is ready for connection to any desired electronic circuit or device, as well as a physical mount and housing for the circuit and the components. It also provides a simple method by which miniaturized units of this type can be rapidly and inexpensively mass produced with any desired internal circuitry that may be called for by the particular application contemplated.

The particulars of the foregoing description are provided merely for purposes of illustration and are subject to a considerable latitude of modification without departure from the novel teachings disclosed herein. Accordingly, the scope of this invention is intended to be limited only as defined in the appended claims, which should be accorded a breadth of interpretation consistent with this specification.

I claim:

1. A combined mount and circuit unit comprising a mounting panel formed of a non-conductive material and having first and second parallel surfaces, a plurality of spaced conductor strips embedded in said first surface of said mounting panel including at least one internal circuit connector strip and a plurality of circuit terminal strips including collector and emitter connector strips, each of said circuit terminal strips including a terminal tab protruding beyond said mounting panel, said mounting panel being formed with a bore intersecting said first and second surfaces, an encapsulated transistor including base, emitter, and collector terminal prongs mounted within said mounting panel opening, said mounting panel having a thickness transversely to said one surface such that said transistor is accommodated entirely within said bore, some of said conductor strips being formed respectively with emitter, collector, and base contact tabs extending across said bore and having holes formed therein receiving said emitter, collector, and base terminal prongs respectively to establish connections to said transistor, and a plurality of resistor stripes of a conductive material of relatively high resistivity imprinted on said first surface each terminating in contact with respective conductor strips to establish resistors connected therebetween.

2. A method of prefabricating a combined mount and circuit unit comprising the steps of forming a mounting panel of a non-conductive material with a bore intersecting one surface thereof and sized to receive a circuit element having terminal means, fabricating a circuit stencil of a conductive material and in part embedding the same in said one surface substantially flush with said one surface in such manner that said circuit stencil comprises a frame member spaced from said mounting panel and a plurality of spaced conductors including a plurality of circuit terminal strips each formed with a terminal tab protruding beyond said mounting panel to adjoin said frame member and a connecting portion embedded in said one surface forming some of said conductors with contact tabs traversing said bore in position to contact the terminal means of said circuit element when the latter is mounted in said bore, and severing said frame member from said conductors and from said terminal tabs.

3. A method of prefabricating a combined mount and circuit unit comprising the steps of forming a mounting panel of a non-conductive material with a bore intersecting one surface thereof and sized to receive a circuit element having terminal means, fabricating a circuit stencil of a conductive material and in part embedding the same in said one surface in such manner that said circuit stencil comprises a frame member spaced from said mounting panel and a plurality of spaced conductors including a plurality of circuit terminal strips each formed with a terminal tab protruding beyond said mounting panel to adjoin said frame member and a connecting portion embedded in said one surface forming some of said conductors with contact tabs traversing said bore in position to contact the terminal means of said circuit element when the latter is mounted in said bore, severing said frame member from said conductors and from said terminal tabs, and imprinting a conductive material of relatively high resistivity over said one surface in a pattern to form at least one resistor stripe terminating in contact with respective conductors to establish a resistor connected therebetween.

4. A method of prefabricating a combined mount and circuit unit comprising the steps of forming a mounting panel of a non-conductive material with a bore intersecting one surface thereof, fabricating a circuit stencil of a conductive material and in part embedding the same in said one surface in such manner that said circuit stencil comprises a frame member spaced from said mounting panel and a plurality of spaced conductors including a plurality of circuit terminal strips each formed with a terminal tab protruding beyond said mounting panel to adjoin said frame member and a connecting portion embedded in said one surface forming some of said conductors with contact tabs traversing said bore, severing said frame member from said conductors and from said terminal tabs, imprinting a conductive material of relatively high resistivity over said one surface in a pattern to form at least one resistor stripe terminating in contact with respective conductor strips to establish a resistor connected therebetween, and mounting in said bore a circuit element including terminal means with the terminal means thereof in contact with respective contact tabs.

5. A method of prefabricating a combined mount and circuit unit comprising the steps of forming a mounting panel of non-conductive material with a bore intersecting one surface thereof, fabricating a metallic circuit stencil and in part embedding the same in said one surface in such manner that said circuit stencil comprises a frame member spaced from said mounting panel and a plurality of spaced conductor strips including a plurality of circuit terminal strips each formed with a terminal tab protruding beyond said mounting panel to adjoin said frame member and a connecting portion embedded in said one surface, forming three of said conductor strips with a base contact tab having a notch formed therein and collector and emitter contact tabs terminating in resilient clips all extending across said bore, bending said resilient clips into said bore, severing said frame member from said conductor strips and from said terminal tabs, imprinting a conductive material of relatively high resistivity over said one surface in a pattern to form at least one resistor stripe terminating in contact with respective conductor strips to establish a resistor connected therebetween, mounting in said bore a transistor including a base wafer and emitter and collector electrodes on opposite sides thereof with the base wafer thereof received in said notch and said emitter and collector electrodes in contact with the resilient clips of said emitter and collector tabs respectively.

6. A transistor mounting element comprising a mounting panel of non-conductive material, said mounting panel having an upper and lower surface and a transistor-receiving opening formed therein extending from said upper surface to said lower surface, a plurality of linear depressions formed in the upper surface of said block, a corresponding number of conductors secured within said depressions and extending outwardly of said block, three of said conductors extending over said transistor-receiving opening for engagement with the terminals of a transistor positioned within said opening, the first one of said three conductors adapted for engagement with the emitter terminal of a transistor, the second one of said three conductors adapted for engagement with the collector terminal of a transistor, and the third one of said three conductors adapted for engagement with the base terminal of a transistor, and resistance elements imprinted on the upper surface of said block interconnecting selected ones of said conductors forming electrical circuits therebetween.

References Cited in the file of this patent

UNITED STATES PATENTS

| | | |
|---|---|---|
| 2,493,199 | Khouri | Jan. 3, 1950 |
| 2,508,030 | Karns | May 16, 1950 |
| 2,738,452 | Martin | Mar. 13, 1956 |
| 2,903,627 | McGarvey | Sept. 8, 1959 |
| 2,945,163 | Kilby | July 12, 1960 |

FOREIGN PATENTS

| | | |
|---|---|---|
| 596,830 | Germany | Apr. 26, 1934 |